United States Patent
Stabler et al.

(10) Patent No.: US 10,892,490 B2
(45) Date of Patent: Jan. 12, 2021

(54) PARTICULATE POLYMER BINDER COMPOSITE

(71) Applicant: Arkema Inc., King of Prussia, PA (US)

(72) Inventors: Sean M. Stabler, Pottstown, PA (US); Ramin Amin-Sanayei, Malvern, PA (US)

(73) Assignee: Arkema Inc, King of Prussia, PA (US)

( * ) Notice: Subject to any disclaimer, the term of this patent is extended or adjusted under 35 U.S.C. 154(b) by 93 days.

(21) Appl. No.: 15/549,736

(22) PCT Filed: Feb. 5, 2016

(86) PCT No.: PCT/US2016/016678
§ 371 (c)(1),
(2) Date: Aug. 9, 2017

(87) PCT Pub. No.: WO2016/130410
PCT Pub. Date: Aug. 18, 2016

(65) Prior Publication Data
US 2018/0047986 A1 Feb. 15, 2018

Related U.S. Application Data

(60) Provisional application No. 62/113,586, filed on Feb. 9, 2015.

(51) Int. Cl.
*H01M 4/62* (2006.01)
*H01M 4/131* (2010.01)
(Continued)

(52) U.S. Cl.
CPC ........... *H01M 4/622* (2013.01); *H01M 2/166* (2013.01); *H01M 4/131* (2013.01); *H01M 4/623* (2013.01); *H01J 37/256* (2013.01); *H01M 10/052* (2013.01)

(58) Field of Classification Search
None
See application file for complete search history.

(56) References Cited

U.S. PATENT DOCUMENTS

| 4,584,244 A | 4/1986 | Fenton |
| 6,830,710 B2 | 12/2004 | Bonnet et al. |

(Continued)

FOREIGN PATENT DOCUMENTS

| CN | 101098024 A | 1/2008 | |
| DE | 3538732 A1 * | 6/1986 | ........... C25B 11/035 |

OTHER PUBLICATIONS

DE3538732A1, Machine Translation, Jun. 1986 (Year: 1986).*
(Continued)

*Primary Examiner* — Katie L. Hammer
(74) *Attorney, Agent, or Firm* — Joanne Rossi

(57) ABSTRACT

The invention relates to a dry free-flowing composite of a sub-micron polymer binder particles and interactive materials, and articles formed therefrom. The polymer particles are formed from a dilute latex polymer and blended with interactive materials, then the blend is spray-dried, to form a dry blend in which less than 10% of all polymer particles are in an agglomerated form. The polymer is preferably a polyvinylidene fluoride, such as Kyblock® PVDF from Arkema. The dry blend will be used to form articles and coatings by many means, for example forming a three dimensional article by heat and pressure, it can be redispersed into an aqueous coating composition, or can be electro-coated onto a substrate.

17 Claims, 2 Drawing Sheets

(51) Int. Cl.
H01M 2/16 (2006.01)
H01M 10/052 (2010.01)
H01J 37/256 (2006.01)

(56) References Cited

U.S. PATENT DOCUMENTS

| | | |
|---|---|---|
| 7,791,860 B2 | 9/2010 | Mitchell et al. |
| 8,072,734 B2 | 12/2011 | Zhong et al. |
| 8,591,601 B2 | 11/2013 | Zhong et al. |
| 8,669,034 B2 | 3/2014 | Silcoff et al. |
| 2002/0168569 A1 | 11/2002 | Barriere et al. |
| 2005/0034299 A1* | 2/2005 | Kurihara ............... H01G 9/155 29/623.5 |
| 2008/0107987 A1 | 5/2008 | Fukushima et al. |
| 2010/0304270 A1 | 12/2010 | Amin-Sanayei et al. |
| 2011/0143198 A1 | 6/2011 | Choi et al. |
| 2011/0189606 A1 | 8/2011 | Silcoff et al. |
| 2011/0299894 A1 | 12/2011 | Fukushima et al. |
| 2012/0015246 A1 | 1/2012 | Amin-Sanayei et al. |
| 2014/0030590 A1* | 1/2014 | Wang ...................... H01B 1/04 429/211 |
| 2014/0264195 A1 | 9/2014 | McMahan et al. |
| 2015/0030906 A1 | 1/2015 | Amin-Sanayei et al. |
| 2015/0231576 A1 | 8/2015 | Stabler et al. |
| 2016/0121249 A1 | 5/2016 | Koslow |

OTHER PUBLICATIONS

Mangal et al. ("The role of physico-chemical and bulk characteristics of co-spray dried L-leucine and polyvinylpyrrolidone on glidant and binder properties in interactive mixtures" International Journal of Pharmaceutics 479 (Jan. 5, 2015), pp. 338-348); (Year: 2015).*

* cited by examiner

PARTICULATE POLYMER BINDER COMPOSITE

This application claims benefit, under U.S.C. § 119 or § 365 of PCT Application Number PCT/US2016/016678, filed Feb. 5, 2016; and U.S. Provisional Application No. 62/113,586, filed Feb. 9, 2015; said applications incorporated herein by reference.

FIELD OF THE INVENTION

The invention relates to a dry free-flowing composite of a sub-micron polymer binder particles and interactive materials, and articles formed therefrom. The polymer particles are formed from a dilute latex polymer and blended with interactive materials, then the blend is spray-dried, to form a dry blend in which less than 10% of all polymer particles are in an agglomerated form. The dry blend will be used to form articles and coatings by many means, for example forming a three dimensional article by heat and pressure, it can be redispersed into an aqueous coating composition, or can be electro-coated onto a substrate.

BACKGROUND OF THE INVENTION

Thermoplastic polymers can be useful as binders, to hold particulate materials together. The thermoplastic polymer can be applied as a melt or in a solvent or aqueous solution or dispersion to coat the particulate materials, and bind them together.

In some applications, such as in battery electrodes and separators, or in block filtration and separation media, the particulate matter is in the form of interactive materials bound together into a porous morphology. The interactive materials are required to have direct contact with liquids and gasses in the environment to be effective. In these cases, it is important that the polymer binder does not completely coat the interactive materials.

One way to provide minimal coating (blockage) of the interactive material surface, yet provide good adhesion between the interactive material particles, is to use a polymer binder in the form of discrete particles. The polymer binder particles should have minimal blockage of the interactive material, yet must be sufficient to hold the interactive matter together—to form a porous web of the interactive matter, where the interactive material has interconnectivity.

In order to increase the binder efficiency (good binding of interactive materials with a minimal amount of polymer binder) the binder particles should have a maximum surface area available for contact with the interactive material.

Surprisingly, it has now been found that greater binder efficiency (increased maximum binder surface) can be achieved in a dry powder interactive matter/polymer binder particle composite, by both decreasing the polymer binder particle size, and decreasing the level of polymer particles that agglomerate. As used herein "polymer agglomerate" means two or more polymer binder particles that adhere together to form an adhered group of particles that has a weight average particle size of greater than 1 micron. A polymer agglomerate decreases the binder efficiency, as the polymer binder particles are less dispersed and less uniform.

SUMMARY OF THE INVENTION

The invention relates to a composite material comprising:
a) discrete polymer particles having an average particle size of less than 1 micron, and
b) an interactive material,
where the polymer particles are adhered to the interactive material, and where the polymer particles consist of less than 10 weight percent of agglomerated polymer particles.

The invention further relates to a process for forming a composite material comprising polymer particles and one or more particulate interactive materials, comprising the steps of:
a) forming a polymer latex comprising discrete polymer particles having an average particle size of less than 1 micron;
b) diluting said polymer latex to between 4 and 25 weight percent of polymer solids;
c) admixing interactive material into said polymer latex to form a blend of polymer particles and interactive material, wherein steps b) and c) can occur in either order or simultaneously;
d) drying said blend to form a free-flowing polymer particle/interactive material composite, wherein said polymer particles adhere to said interactive material, and wherein less than 10 weight percent of said polymer particles in the dry composite are in an agglomerated form;
e) forming said polymer particle/interactive material into an article or a coating on an article, wherein said polymer particles remain as discrete particles, binding said interactive material together.

The invention also relates to articles made from the polymer particle/particulate material composite.

DETAILED DESCRIPTION OF THE INVENTION

Figure 1:
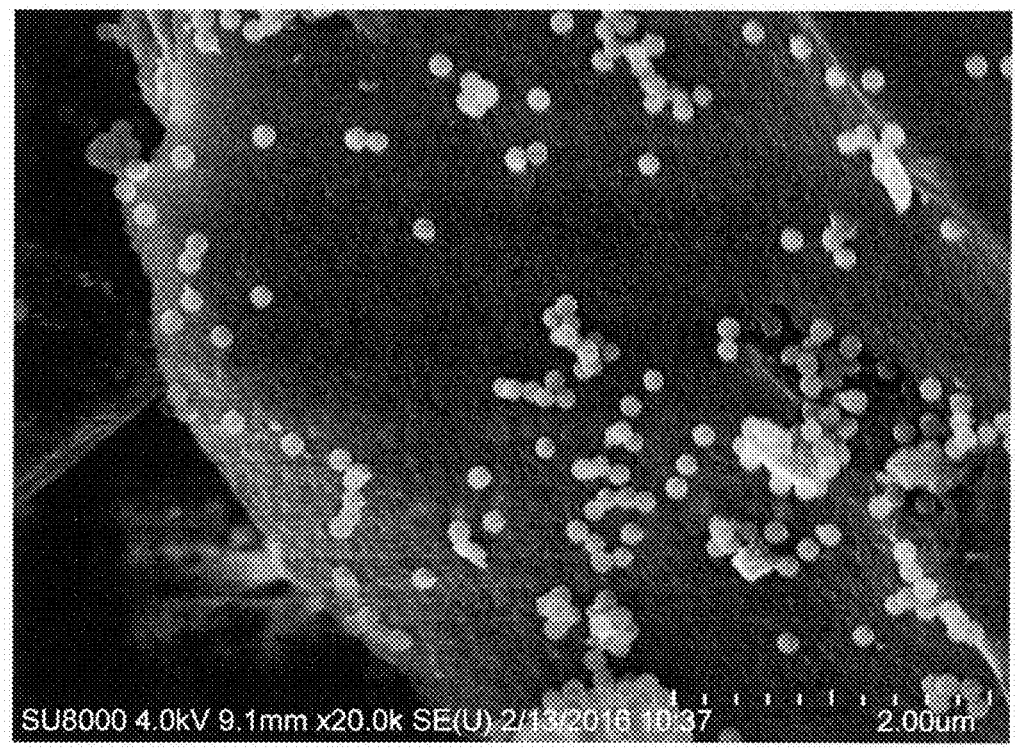
FIGS. 1 and 2 are SEM images of the 5% PVDF binder solids samples.

All references listed in this application are incorporated herein by reference. All percentages in a composition are weight percent, unless otherwise indicated, and all molecular weights are given as weight average molecular weight, unless stated otherwise. Combinations of different elements described herein are also considered as part of the invention.

The invention relates to a dry composite of a sub-micron polymer binder particles and interactive materials, and articles formed therefrom. Less than 10 weight percent of the polymer particles are in an agglomerated form.

Polymer Particles

The polymer particles of the composite of the invention are thermoplastic polymer particles in the sub-micron range. The weight average particle size is less than 1 micron, preferably less than 500 nm, preferably less than 400 nm, and more preferably less than 300 nm. The weight average particle size is generally at least 20 nm and preferably at least 50 nm.

Useful polymers include, but are not limited to fluoropolymers, styrene-butadiene rubbers (SBR), ethylene vinyl acetate (EVA), acrylic polymers such as polymethyl methacrylate polymer and copolymers, polyurethanes, styrenic polymers, polyamides, polyester including polyethylene terephthalate, polyvinyl chlorides, polycarbonate, polyolefins such as polyethylene, and polypropylene, and thermoplastic polyurethane (TPU). In order to obtain the small polymer particle size useful in the invention, it is preferred that the thermoplastic polymers can be made by emulsion (or inverse emulsion) polymerization.

Thermoplastic polymers having low crystallinity, or no crystallinity are especially useful, as they are more flexible, are more easily softened, and withstand the pressures of the manufacturing process better than crystalline polymer.

Preferred polymers are polyamides, and fluoropolymers, with homopolymers and copolymers of polyvinylidene fluoride being especially useful.

Preferably, the binder is a fluoropolymer. Useful fluoropolymers are thermoplastic homopolymers and copolymers having greater than 50 weight percent of fluoromonomer units by weight, preferably more than 65 weight percent, more preferably greater than 75 weight percent and most preferably grater than 90 weight percent of one or more fluoromonomers. Useful fluoromonomers for forming the fluoropolymer include but are not limited to: vinylidene fluoride (VDF or VF2), tetrafluoroethylene (TFE), trifluoroethylene (TrFE), chlorotrifluoroethylene (CTFE), hexafluoropropene (HFP), vinyl fluoride (VF), hexafluoroisobutylene (HFIB), perfluorobutylethylene (PFBE), pentafluoropropene, 3,3,3-trifluoro-1-propene, 2-trifluoromethyl-3,3,3-trifluoropropene, fluorinated vinyl ethers including perfluoromethyl ether (PMVE), perfluoroethylvinyl ether (PEVE), perfluoropropylvinyl ether (PPVE), perfluorobutylvinyl ether (PBVE), longer chain perfluorinated vinyl ethers, fluorinated dioxoles, partially- or per-fluorinated alpha olefins of $C_4$ and higher, partially- or per-fluorinated cyclic alkenes of $C_3$ and higher, and combinations thereof.

Especially preferred fluoropolymers are polyvinylidene fluoride (PVDF) homopolymers, and copolymers, and polytetrafluroethylene (PTFE) homopolymers and copolymers. While the invention applies to all thermoplastic polymers, and in particular all fluoropolymers and copolymers, vinylidene fluoride polymers will be used to illustrate the invention, and are the preferred polymer. One of ordinary skill in the art will understand and be able to apply the specific references to PVDF to these other thermoplastic polymers, which are considered to be within the realm of, and embodied in the invention.

In one embodiment, vinylidene fluoride copolymers are preferred, due to their lower crystallinity (or no crystallinity), making them more flexible than the semi-crystalline PVDF homopolymers. Flexibility of the binder provides advantages of a more flexible electrode that can better withstand the manufacturing process, as well as increased pull-through strength and better adhesion properties. Such copolymers include those containing at least 50 mole percent, preferably at least 75 mole %, more preferably at least 80 mole %, and even more preferably at least 85 mole % of vinylidene fluoride copolymerized with one or more comonomers selected from the group consisting of tetrafluoroethylene, trifluoroethylene, chlorotrifluoroethylene, hexafluoropropene, vinyl fluoride, pentafluoropropene, tetrafluoropropene, trifluoropropene, perfluoromethyl vinyl ether, perfluoropropyl vinyl ether and any other monomer that would readily copolymerize with vinylidene fluoride. In one embodiment, up to 30%, preferably up to 25%, and more preferably up to 15% by weight of hexafluoropropene (HFP) units and 70% or greater, preferably 75% or greater, more preferably 85% or greater by weight or more of VDF units are present in the vinylidene fluoride polymer. It is desired that the HFP units be distributed as homogeneously as possible to provide PVDF-HFP copolymer with excellent dimensional stability in the end-use environment.

The PVDF for use as a binder in the electrode composition preferably has a high molecular weight. By high molecular weight, as used herein is meant PVDF having a melt viscosity of greater than 1.0 kilopoise, preferably greater than 5 Kpoise, more preferably greater than 10 Kpoise, and most preferably greater than 15 Kpoise, according to ASTM method D-3835 measured at 450° F. and 100 $sec^{-1}$. The PVDF used in the invention is generally prepared by means known in the art, using aqueous free-radical emulsion polymerization—although suspension, solution and supercritical $CO_2$ polymerization processes may also be used. In a general emulsion polymerization process, a reactor is charged with deionized water, water-soluble surfactant capable of emulsifying the reactant mass during polymerization and optional paraffin wax antifoulant. The mixture is stirred and deoxygenated. A predetermined amount of chain transfer agent, CTA, is then introduced into the reactor, the reactor temperature raised to the desired level and vinylidene fluoride (and possibly one or more comonomers) are fed into the reactor. Once the initial charge of vinylidene fluoride is introduced and the pressure in the reactor has reached the desired level, an initiator emulsion or solution is introduced to start the polymerization reaction. The temperature of the reaction can vary depending on the characteristics of the initiator used and one of skill in the art will know how to do so. Typically the temperature will be from about 30° to 150° C., preferably from about 60° to 120° C. Once the desired amount of polymer has been reached in the reactor, the monomer feed will be stopped, but initiator feed is optionally continued to consume residual monomer. Residual gases (containing unreacted monomers) are vented and the latex recovered from the reactor.

The surfactant used in the polymerization can be any surfactant known in the art to be useful in PVDF emulsion polymerization, including perfluorinated, partially fluorinated, and non-fluorinated surfactants. Preferably the PVDF emulsion of the invention is fluorosurfactant-free, with no fluorosurfactants being used in any part of the polymerization. Non-fluorinated surfactants useful in the PVDF polymerization could be both ionic and non-ionic in nature including, but are not limited to, 3-allyloxy-2-hydroxy-1-propane sulfonic acid salt, polyvinylphosphonic acid, polyacrylic acids, polyvinyl sulfonic acid, and salts thereof, polyethylene glycol and/or polypropylene glycol and the block copolymers thereof, alkyl phosphonates and siloxane-based surfactants.

The PVDF polymerization results in a latex generally having a solids level of 10 to 60 percent by weight, preferably 10 to 50 percent.

In one embodiment, the polymer latex is used without any additional additives, since particulate materials used as absorbents (such as activated carbon and molecular sieves) could be have pre-mature fouling due to the adsorption of extra additives.

Interactive Materials

One or more types of interactive particles or fibers are combined with the fluoropolymer, polyamide or other thermoplastic polymer binder. The interactive particles or fibers are not merely fillers or pigments, but are those which have a physical, electrical, or chemical interaction when they come into proximity or contact with dissolved or suspended materials in a fluid (liquid or gas) composition. They can also be materials useful in battery electrodes for conductance of electrons. Depending on the type of activity of the interactive particles, the particles may separate the dissolved or suspended materials by chemical reaction, physical entrapment, physical attachment, electrical (charge or ionic)

attraction, or similar means. Examples of interactions anticipated by the invention include, but are not limited to: physical entrapment of compounds from the fluid, such as in activated carbon, nano clays, or zeolite particles; ion exchange resins; catalysts; electromagnetic particles; acid or basic particles for neutralization; carbonaceous materials for a negative electrode; a Li plus transition metal oxide, sulfide or hydroxide for a positive electrode; etc.

Examples of interactive particles of fibers include, but are not limited to: metallic particles of 410, 304, and 316 stainless steel, copper, aluminum and nickel powders, ferromagnetic materials, activated alumina, activated carbon, carbon nanotubes, silica gel, acrylic powders and fibers, cellulose fibers, glass beads, various abrasives, common minerals such as silica, wood chips, ion-exchange resins, molecular sieves, ceramics, zeolites, diatomaceous earth, polyester particles and fibers, and particles of engineering resins such as polycarbonate. The interactive particles could also be enzymes, antibodies, and proteins immobilized on a support substrate. Useful positive electrode materials include, but are not limited to, $LiCoO_2$, $LiNi_xCo_{1-x}O_2$, $LiMn_2O_2$, $LiNiO_2$, $LiFePO_4$, $LiNi_xCo_yMn_zO_m$, $LiNi_xMn_yAl_zO_m$ where x+y+z=1 and m is an integer representing the number of oxygen atom in the oxide to provide an electron-balanced molecule; as well as lithium-metal oxides such as lithium cobalt oxide, lithium iron phosphate, lithium manganese phosphate, lithium-nickel oxide, and lithium-manganese oxide. Useful negative electrode materials include, but are not limited to nano-titanate, and carbonaceous materials such as graphite, manmade graphite, carbon, carbon black, activated carbon, acetylene black, phenolic resin, pitch, tar, etc.

The interactive particle of the invention generally applicable are in the size range of 0.1 to 3,000 micrometers in diameter and fibers of 0.1 to 250 micrometers in diameter of essentially unlimited length to width ratio. Fibers are preferably chopped to no more than 5 mm in length. Fibers cannot easily go though a spray dryer, but could be used in composites dried by other means. Fibers or powders should have sufficient thermal conductivity to allow heating of the powder mixtures. In addition, in an extrusion process, the particles and fibers must have melting points sufficiently above the melting point of the fluoropolymer binder resin to prevent both substances from melting and producing a continuous melted phase rather than the usually desired multi phase system.

The ratio of polymer binder particles to interactive particles or fibers is from 0.01-15 weight percent of fluoropolymer solids to 85 to 99.99 weight percent interactive particles or fibers, preferably from 0.1-11 weight percent of fluoropolymer solids to 89 to 99.9 weight percent interactive particles or fibers, more preferably from 0.2-8 weight percent of fluoropolymer solids to 92 to 99.8 weight percent interactive particles or fibers, and in one embodiment from 0.3-6 weight percent of fluoropolymer solids to 94 to 99.7 weight percent interactive particles or fibers. If less fluoropolymer is used, complete interconnectivity may not be achieved, and if more fluoropolymer is used, there is a reduction in contact between the interactive particles and the fluid passing through the separation article. The efficient use of the polymer particle binder due to good distribution, small particle size and low agglomeration, allows for the effective amount of binder to be decreased over polymer binders of larger particle size, less efficient distribution and higher agglomeration, as found in the art.

Process

Once the polymer latex is formed, it is diluted to 4-25 weight percent of solids, and preferably from 10 to 20 weight percent solids by the addition of water with stirring. The dilution allows for a better dispersion with the interactive particles, and decreases the likelihood of polymer particle agglomeration. One or more types of interactive materials are then added to the diluted latex with adequate stirring to form a homogeneous aqueous dispersion of the polymer particle and interactive materials. Preferably, the interactive materials are first dispersed in water prior to addition into the polymer latex. In an alternative embodiment, the interactive materials can be added to the polymer latex, and the admixture diluted with water.

The dispersion blend is then dried, to form a composite of the interactive materials with the discrete sub-micron polymer binder particles on the surface. The drying step can be done by any known method that will form the composite with the formation of less than 10 weight percent, and preferably less than 5 weight percent of polymer agglomerates. Drying generally uses heat and/or vacuum to remove the water and produce the composite. In one embodiment, the dispersion blend is spray-dried to form the composite. In another embodiment, the blend dispersion is poured onto a belt conveyor and a combination of vacuum and heat (generally an oven) is used to drive off the water, and to sinter the polymer particles to the interactive material. The flat sheet structure formed can then be collected and rolled into semi-finished good which could be die cut to dimensions or pleated and further wrapped into filtration cartridges.

In one embodiment, additional polymer binder powder can be added to the dried dispersion blend of interactive material having discrete sub-micron polymer binder particles on the surface. This is especially useful to provide extra binding power when additional additives are added to the interactive particle/polymer binder dry blend. The additional binder could be the same or different from the polymer binder particles of the latex already used. Preferably any additional binder is a polyvinylidene fluoride polymer or copolymer. The added binder could be added at low levels of from 0-10 weight percent, and more preferably at from 0.01 to 4 weight percent, based on the total interactive material/polymer particle composite solids. The total polymer solids will be less than 15 weight percent, preferably less than 12 weight percent, and most preferably 10 weight percent or below, based on the total solids. The additional polymer and any additives can be added as separate powders (and must be added as separate powders if the additive is water-sensitive (absorbs, adsorbs or reacts with water), or could be used as a polymer latex blended with one or more additives, followed by drying—which could preserve the low agglomerate, discrete sub-micron particles.

Uses

The dry composite composition of the invention can be formed into useful objects by any number of methods known in the art. The process should be one that may soften the polymer particles, but will not cause them to melt and flow to the point that they contact other polymer particles and form agglomerates or a continuous layer. To be effective in the contemplated end-uses, the polymer binder remains as discreet polymer particles that bind the interactive particles into an interconnected web, so gases and liquids can easily flow and contact the interactive materials.

In one embodiment, the dry composite material is applied to at least one surface of an electroconductive substrate to form an electrode or battery separator. The dry composite may be pressed onto said electroconductive substrate by means such as calendaring, such as described in U.S. Pat. Nos. 7,791,860, 8,072,734, and 8,591,601. In the process of the art, the polymer particles were dried and stored prior to blending with the interactive material, leading to agglomeration, and making uniform distribution of the polymer binder extremely difficult.

In one embodiment, the dry composite can be re-dispersed in an aqueous or solvent dispersion, by means of a dispersing aid, as known in the art. The polymer binder will remain uniformly distributed and in a non-agglomerated particle form as part of the composite. The dispersion can then be applied to an electroconductive substrate by a typical coating means, and dried to form an electrode or separator for a battery.

In another embodiment, the polymer binder particles can be formed into a porous block article in an extrusion process, such as that described in U.S. Pat. No. 5,331,037. The polymer binder/interactive material composite of the invention is dry-blended with other additives, such as processing aids, and extruded, molded or formed into articles. Continuous extrusion under heat, pressure and shear while can produce an infinite length 3-dimensional multi phase profile structure consisting of binder, interactive particles, air, and/or other additives. In order to form the continuous web of forced-point bonding of binder to the interactive materials, a critical combination of applied pressure, temperature and shear is used. The composite and additives blend is brought to a temperature above the softening temperature, but below the melting point, significant pressure applied to consolidate the materials, and enough shear to spread the binder and form a continuous web. The porous block article is useful for separation and filtration of liquid and gaseous streams.

In yet another embodiment, the composite if formed into a dry sheet on a conveyor belt, and the sheet formed into articles.

In another embodiment, the blend can be added to a compression molder under sufficient heat and pressure to bind the composite blend into a multi phase system of binder, interactive particle, air, and/or other additives.

EXAMPLES

A Kyblock® PVDF homopolymer latex (Arkema) was used for the study having 33.84% solids. The latex was diluted down to 0.5% solids using DI water. The final solids content of the latex was measured to be 0.42%. The blends was made such that the PVDF contents are 5% and 10% by weight in the final mixture. Below is the summary of the amount of materials used.

| Total weight of mixture | | 5 gm |
|---|---|---|
| Activated Carbon (80*325) | 95% | 4.75 gm |
| Kyblock ® PVDF | 5% | 0.25 gm |
| Final Latex | Containing 0.42% polymer solids | 59.52 gm |
| Total weight of mixture | | 5 gm |
| Activated Carbon (80*325) | 90% | 4.5 gm |
| Kyblock ® PVDF | 10% | 0.5 gm |
| Final Latex | Containing 0.42% polymer solids | 119.05 gm |

Figure 2:
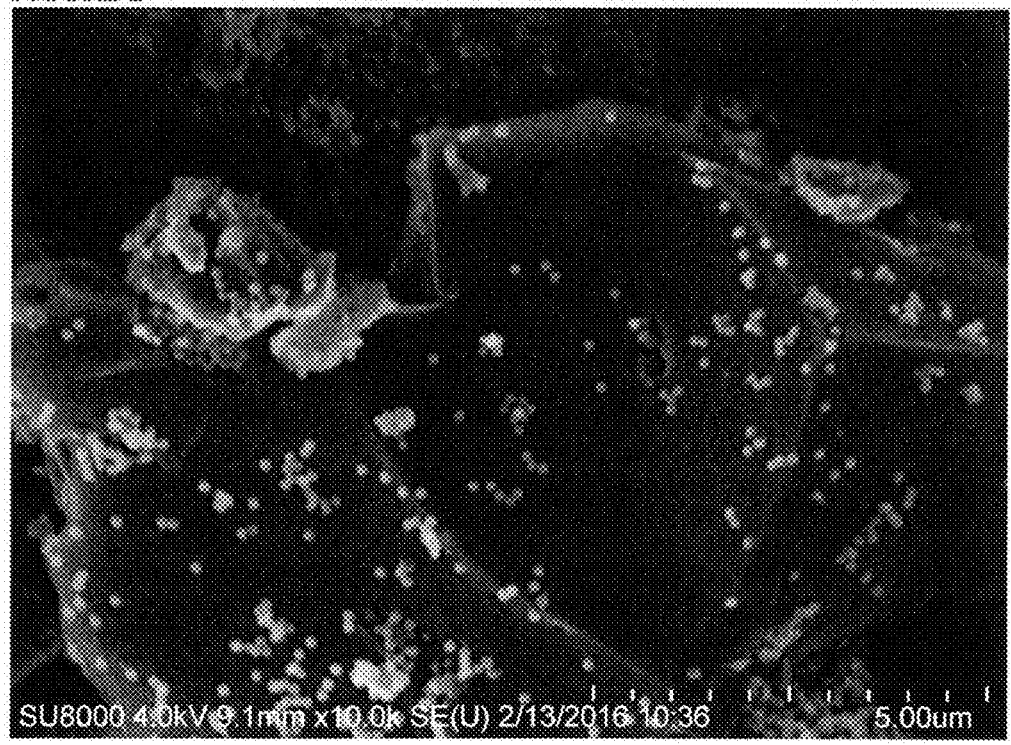
Figure 3:
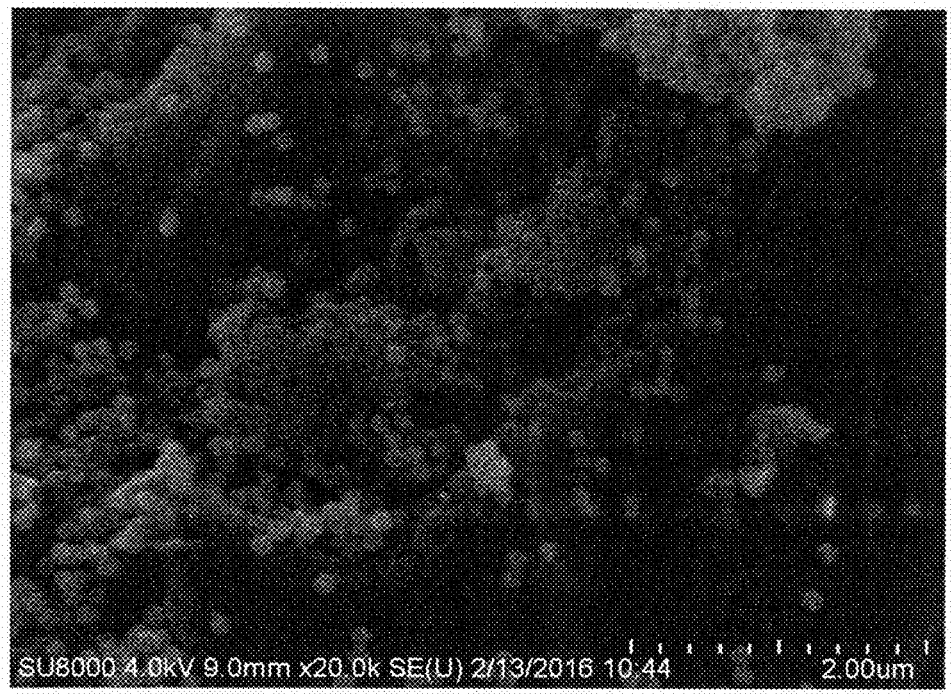
FIGS. 3 and 4 are SEM images of the 10% PVDF binder solids samples.
Figure 4:
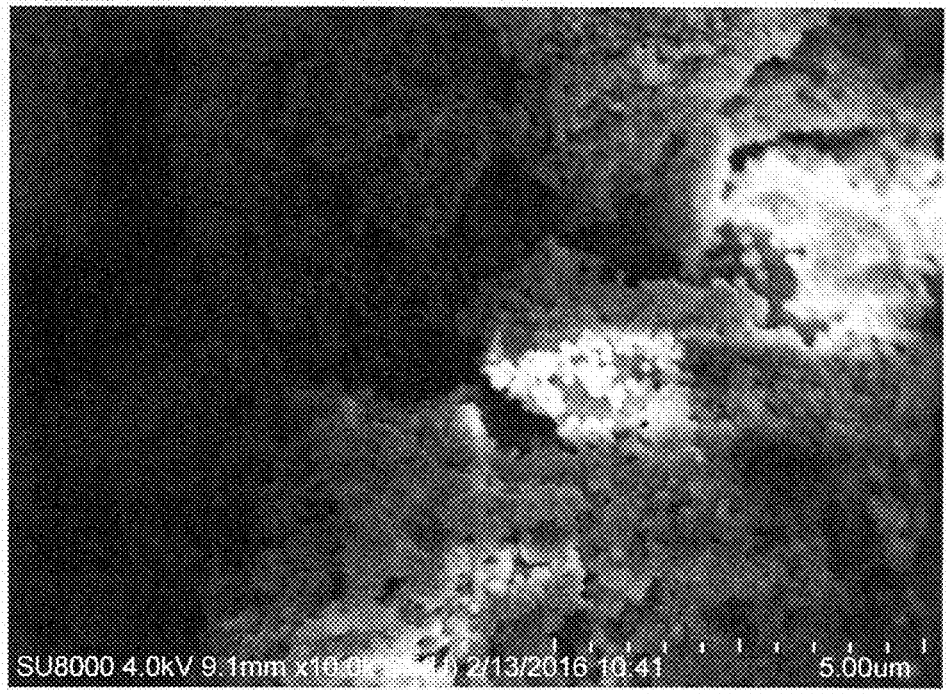

The materials were placed in glass jars, and placed on a roller overnight for mixing. The next day, samples were spread on an aluminum tray and were placed in the vacuum oven at 110° C. for 24 hours. The samples were dried and were packed in the jar for SEM imaging. Results were visually inspected using field emission scanning electron microscopy (SEM), 4 keV accelerating voltage. The SEMs are shown in FIGS. 1-4. Small individual binder particles are noted.

This process resulted in adequate dispersion of discrete binder particles. The prepared sample was next placed into a compression mold and pressed under <100 psi pressure in a 220° C. oven for 30 mins. The hot mold was removed from the oven and allowed to cool 30 mins before the part was ejected. The ejected mold had significant physical properties suitable for a structure 3D adsorption or filtration device.

Within this specification embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

Aspects of the invention include:

1. A composite material comprising:
   a) discrete polymer particles having an average particle size of less than 1 micron, and
   b) an interactive material,
wherein said polymer particles are adhered to said interactive material, and wherein said polymer particles consist of less than 10 weight percent of agglomerated polymer particles.

2. The composite material of aspect 1, wherein said composite material is in the form of dry composite particles.

3. The composite material of any of aspect 1 and 2, wherein said average particle size of said polymer particles is from 20 to 500 nm, preferably from 50 to 400 nm.

4. The composite material of any of aspects 1-3, wherein said polymer particles are selected from the group consisting of fluoropolymers, styrene-butadiene rubbers (SBR), ethylene vinyl acetate (EVA), acrylic polymers, polymethyl methacrylate polymer and copolymers, polyurethanes, styrenic polymers, polyamides, polyester, polyethylene terephthalate, polyolefins, polyvinyl chlorides, polycarbonate and thermoplastic polyurethane (TPU), and mixtures thereof, preferably wherein said polymer particles are polyamides, or a fluoropolymer selected from polyvinylidene (PVDF) homopolymer and copolymers comprising at least 75 mole percent of vinylidene fluoride monomer units.

5. The composite of any of aspects 1-4, wherein said composite material comprises
   a) 0.01 to 15 weight percent, preferably from 0.2 to 8 weight percent, and more preferably from 0.3 to 6 weight percent, of discrete polymer particles, and
   b) 85 to 99.99 weight percent, preferably 92 to 99.8 weight percent, and more preferably 94 to 99.7 weight percent of said interactive material.

6. A process for forming a composite material comprising polymer particles and one or more interactive materials, comprising the steps of:
   a) forming a polymer latex comprising discrete polymer particles having an average particle size of less than 1 micron, and preferably from 20 to 500 nm;
   b) diluting said polymer latex to between 4 and 25 weight percent, and preferably from 10 to 20 weight percent of polymer solids;
   c) admixing interactive material into said polymer latex to form a blend of polymer particles and interactive material, wherein steps b) and c) can occur in either order or simultaneously;

d) drying said blend to form a free-flowing polymer particle/interactive material composite, wherein said polymer particles adhere to said interactive material, and wherein less than 10 weight percent, and preferably less than 5 weight percent of said polymer particles in the dry composite are in an agglomerated form;

e) forming said polymer particle/interactive material into an article or a coating on an article, wherein said polymer particles remain as discrete particles, binding said interactive material together.

7. The process of aspect 6, further comprising dispersing said interactive materials in water 8. An article comprising said composite material of aspect 1 or made by said process of claim 6.

9. The article of aspect 8, wherein said article is an electrode or separator in a battery.

10. The article of aspect 8, wherein said article is a block article is useful for separation and filtration of liquid and gaseous streams.

What is claimed is:

1. A composite material comprising:
  a) discrete polymer binder particles having an average particle size of less than 1 micron, and
  b) an interactive material selected from the group consisting of activated carbon, nano clays, zeolite particles, ion exchange resins; a lithium plus transition metal oxide, sulfide or hydroxide for a positive electrode; metallic particles of 410 stainless steel, 304 stainless steel, 316 stainless steel, copper, aluminum and nickel powders, activated alumina, carbon nanotubes, cellulose fibers, silica, wood chips, ceramics, titanate, graphite, carbon black, and acetylene black;
wherein said discrete polymer binder particles are adhered to the surface of said interactive material, and wherein said discrete polymer binder particles consist of less than 10 weight percent of agglomerated polymer particles, wherein said interactive material are particles or fibers that have a physical, electrical or chemical interaction with a dissolved or suspended material in a fluid composition; and wherein the composite material is a dry and free flowing polymer binder particle/interactive material composite.

2. The composite material of claim 1, wherein said composite material is in the form of dry composite particles.

3. The composite material of claim 1, wherein said average particle size of said polymer particles is from 50 to 400 nm.

4. The composite material of claim 1, wherein said polymer particles are selected from the group consisting of fluoropolymers, styrene-butadiene rubbers (SBR), ethylene vinyl acetate (EVA), acrylic polymers, polymethyl methacrylate polymer and copolymers, polyurethanes, styrenic polymers, polyamides, polyester, polyethylene terephthalate, polyolefins, polyvinyl chlorides, polycarbonate and thermoplastic polyurethane (TPU), and mixtures thereof.

5. The composite material of claim 4, wherein said polymer particles are polyamides, or a fluoropolymer selected from polyvinylidene fluoride (PVDF) homopolymer and copolymers comprising at least 75 mole percent of vinylidene fluoride monomer units.

6. The composite of claim 1, wherein said composite material comprises
  a) 0.01 to 15 weight percent of discrete polymer particles, and
  b) 85 to 99.99 weight percent of said interactive material.

7. The composite of claim 1, wherein said composite material comprises
  a) 0.2 to 8 weight percent of discrete polymer particles, and
  b) 92 to 99.8 weight percent of said interactive material.

8. The composite of claim 1, wherein said composite material comprises
  a) 0.3 to 6 weight percent of discrete polymer particles, and
  b) 94 to 99.7 weight percent of said interactive material.

9. A process for forming a composite material comprising polymer particles and one or more interactive materials, comprising the steps of:
  a) forming a polymer latex comprising discrete polymer particles having an average particle size of less than 1 micron;
  b) diluting said polymer latex to between 4 and 25 weight percent of polymer solids;
  c) admixing interactive material into said polymer latex to form a blend of polymer particles and interactive material, wherein steps b) and c) can occur in either order or simultaneously;
  d) drying said blend to form a free-flowing polymer particle/interactive material composite, wherein said polymer particles adhere to said interactive material, and wherein less than 10 weight percent of said polymer particles in the dry composite are in an agglomerated form;
  e) forming said polymer particle/interactive material into an article or a coating on an article, wherein said polymer particles remain as discrete particles, binding said interactive material together,
wherein said interactive material are particles or fibers that have a physical, electrical or chemical interaction with a dissolved or suspended material in a fluid composition; and wherein the interactive material is selected from the group consisting of activated carbon, nano clays, zeolite particles, ion exchange resins; a lithium plus transition metal oxide, sulfide or hydroxide for a positive electrode; metallic particles of 410 stainless steel, 304 stainless steel, 316 stainless steel, copper, aluminum and nickel powders, activated alumina, carbon nanotubes, cellulose fibers, silica, wood chips, ceramics, titanate, graphite, carbon black, and acetylene black.

10. The process of claim 9, wherein said diluted latex of b) contains from 10 to 20 weight percent solids, and wherein less than 5 weight percent of said polymer particles of said dry composite are in an agglomerated form.

11. The process of claim 9, wherein said discrete polymer particles having a weight average particle size of from 20 to 500 nm.

12. The process of claim 9, further comprising dispersing said interactive materials in water.

13. An article comprising said composite material of claim 1.

14. The article of claim 13, wherein said article is an electrode or separator in a battery.

15. The article of claim 13, wherein said article is a block article is useful for separation and filtration of liquid and gaseous streams.

16. The composite material of claim 1, wherein said polymer particles comprise fluoropolymer selected from polyvinylidene fluoride (PVDF) homopolymer and copolymers comprising at least 75 mole percent of vinylidene fluoride monomer units.

17. The composite material of claim 1, wherein said interactive material is selected from the group consisting of activated carbon, nano clays, zeolite particles, ion exchange resins and activated alumina.

* * * * *